United States Patent [19]

Yamashita

[11] Patent Number: 5,789,820
[45] Date of Patent: Aug. 4, 1998

[54] METHOD FOR MANUFACTURING HEAT RADIATING RESIN-MOLDED SEMICONDUCTOR DEVICE

[75] Inventor: Chikara Yamashita, Tokyo, Japan

[73] Assignee: NEC Corporation, Tokyo, Japan

[21] Appl. No.: 808,531

[22] Filed: Feb. 28, 1997

[30] Foreign Application Priority Data

Feb. 28, 1996 [JP] Japan ................... 8-067124

[51] Int. Cl.⁶ ............................................ H01L 23/28
[52] U.S. Cl. ........................ 257/787; 257/706; 257/707
[58] Field of Search ........................... 257/787, 668, 257/782, 666, 783, 730, 706, 707; 438/122, 126, 127, 113, 977

[56] References Cited

U.S. PATENT DOCUMENTS 5,397,746  3/1995  Blish, II ........................... 438/122

FOREIGN PATENT DOCUMENTS

| 2-154482 | 6/1990 | Japan | 257/787 |
| 4-245462 | 9/1992 | Japan . | |
| 4-312933 | 11/1992 | Japan | 257/783 |
| 6-140563 | 5/1994 | Japan | 257/782 |

*Primary Examiner*—Mahshid D. Saadat
*Assistant Examiner*—S. V. Clark
*Attorney, Agent, or Firm*—Foley & Lardner

[57] ABSTRACT

In a method for manufacturing a heat radiating resin-molded semiconductor device, a protrusion is formed on a side peripheral surface of a semiconductor chip, and the semiconductor chip is sealed with resin, so that spreading of the resin toward a back surface of the semiconductor chip is prevented by the protrusion. Also, a heat radiator is mounted on a back surface of the semiconductor chip.

16 Claims, 9 Drawing Sheets

METHOD FOR MANUFACTURING HEAT RADIATING RESIN-MOLDED SEMICONDUCTOR DEVICE

BACKGROUND OF THE INVENTION

1. Field of the Invention

The present invention relates to a heat radiating resin-molded semiconductor device, and more particularly, to a method for manufacturing a heat radiating resin-molded semiconductor device where a film carrier type semiconductor element is resin-molded.

2. Description of the Related Art

Generally, in a film carrier type semiconductor device, a base film is provided by carrier sprockets, positioning sprockets and, device holes in an insulating film such as polyimide, polyester or glass epoxy. Then, a metal film made of copper or the like is adhered to the base film, and is etched to form leads and electrical test pads on the base film. Next, bumps of a semiconductor chip are adhered by a thermal contact bonding method or a eutectic method to innerlead portions of the leads protruding in the device hole, which is called an innerlead bonding (ILB) operation. In this state, an electrical test and a burn-in test (BT) are carried out to determine whether or not the semiconductor device is normal. Next, outerlead portions of the leads opposite to the device hole are cut to adjust the length of the outerlead portions. Finally, the adjusted outerlead portions of the leads are bonded on bonding pads of a printed board, which is called an outerlead bonding (OLB) operation. Thus, assembling of the device is completed.

Even in the above-mentioned film carrier type semiconductor device, when the semiconductor chip has a large heat radiating power, a heat sink is provided (see JP-A-4-245462). That is, the bumps of a semiconductor chip are bonded on the outerlead portions of leads adhered to the film carrier tape in an ILB operation. Then, the semiconductor chip is coupled to a heat sink by an adhesive layer. Next, the device is sealed by resin, and the resin is hardened by curing. This will be explained later in detail.

In the prior art method, however, after the ILB operation is carried out, the semiconductor chip is substantially in a floating state. Therefore, if a sufficiently large pressure is applied to the film carrier tape, the leads may be deformed or broken, so that the reliability is reduced. On the other hand, if an insufficient pressure is applied to the film carrier tape, the adherence of the heat sink to the semiconductor chip may be insufficient, so that the heat radiating effect is reduced, thus creating cracks in the semiconductor chip.

Therefore, it is preferable to adhere radiating means such as a heat sink to a semiconductor chip after resin-molding. This also will be explained later in detail. In this case, however, resin may be spread on the back surface of the semiconductor chip. For example, the thickness of the resin on the back surface of the semiconductor chip may be about 30 to 50 μm. Therefore, since adhesives for adhering the semiconductor chip to a heat radiating element such as a heat sink are usually about 10 to 20 μm thick, the adherence between the back surface of the semiconductor chip and the heat radiating element is nonuniform. As a result, the heat radiation effect is reduced, thus creating cracks in the semiconductor chip.

SUMMARY OF THE INVENTION

It is an object of the present invention to provide a method for manufacturing a heat radiating resin-molded semiconductor device, which can prevent resin from being spread on a back surface of a semiconductor chip.

Another object is to provide a heat radiating resin-molded semiconductor device capable of improving the heat dissipation effect.

According to the present invention, in a method for manufacturing a heat radiating resin-molded semiconductor device, a protrusion is formed on a side peripheral surface of a semiconductor chip, and the semiconductor chip is sealed with resin, so that spread of the resin toward a back surface of the semiconductor chip is prevented by the protrusion.

Also, a heat radiator is mounted on a back surface of the semiconductor chip.

Thus, the adherence of the semiconductor chip and the heat radiator becomes uniform.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art methods for manufacturing a heat radiating resin-molded semiconductor device will be explained with reference to FIGS. 1A, 1B, 2A, 2B, 3A and 3B.

Figure 1A:
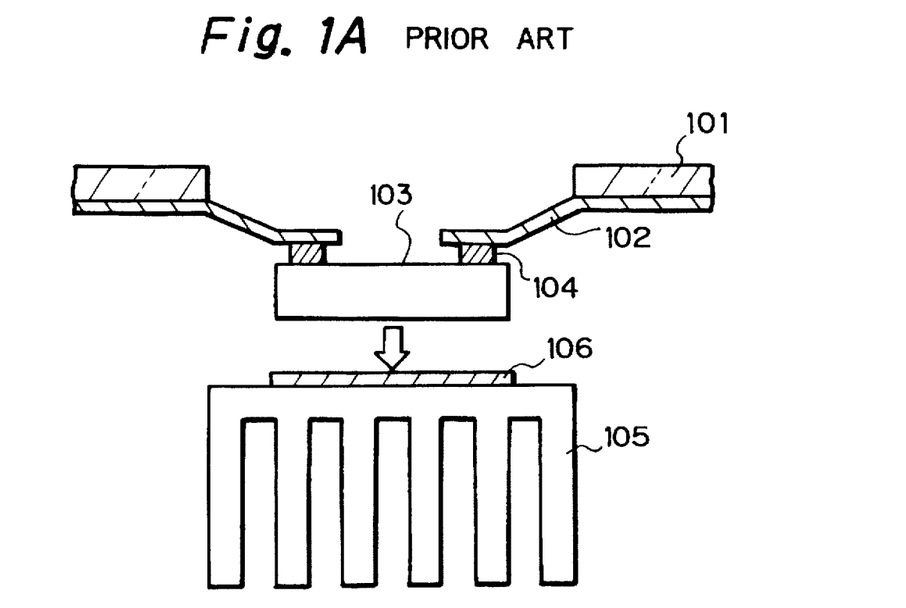
FIGS. 1A and 1B are diagrams for explaining a first prior art method for manufacturing a heat radiating resin-molded semiconductor device.
Figure 1B:
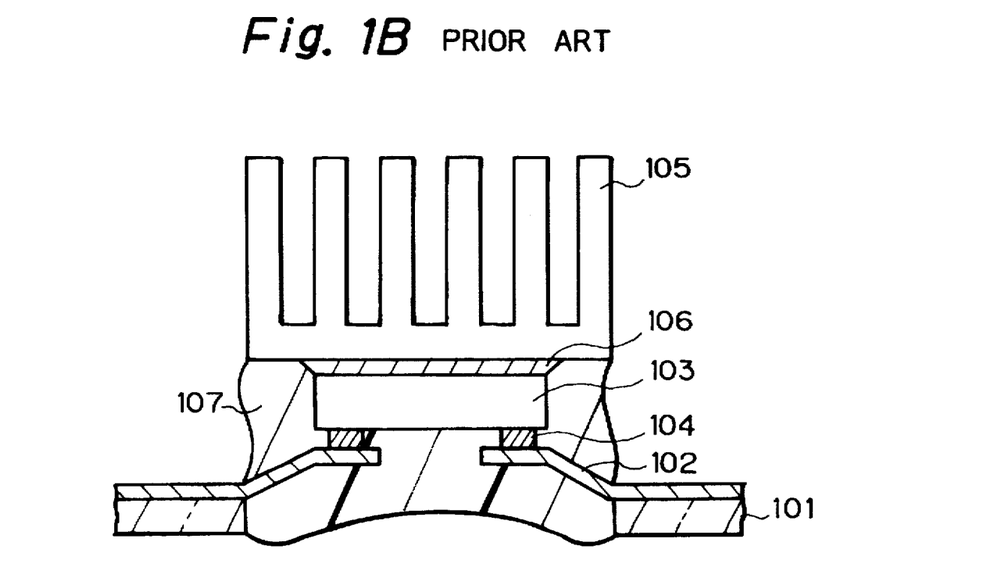

FIGS. 1A and 1B show a first prior art method for manufacturing a heat radiating resin-molded semiconductor device (see JP-A-4-245462).

In FIG. 1A, reference numeral 101 designates a film carrier tape to which innerlead portions of leads 102 are adhered. Also, reference numeral 103 designates a semiconductor chip having bumps 104. The bumps 104 are bonded on the outerlead portions of the leads 102 in an ILB operation. Then, the semiconductor chip 103 is coupled to a heat sink 105 by an adhesive layer 104.

Next, as shown in FIG. 1B, the device is sealed by a resin layer 107, and the resin layer 107 is hardened by curing.

In the prior art method as shown in FIGS. 1A and 1B, however, after the ILB operation is carried out, the semiconductor chip 103 is substantially in a floating state. Therefore, if a sufficiently large pressure is applied to the film carrier tape 101 to adhere the semiconductor chip 103 to the heat sink 105, the leads 102 may be deformed or broken, so that the reliability is reduced. On the other hand, if an insufficient pressure is applied to the film carrier tape 101 to adhere the semiconductor chip 103 to the heat sink 105, the adherence of the heat sink 105 to the semiconductor chip 103 may be insufficient, so that the heat radiating effect is reduced, thus creating cracks in the semiconductor chip 103.

Therefore, it is preferable to adhere radiating means such as a heat sink to a semiconductor chip after resin-molding, as shown in FIGS. 2A and 2B and FIGS. 3A and 3B.

Figure 2A:
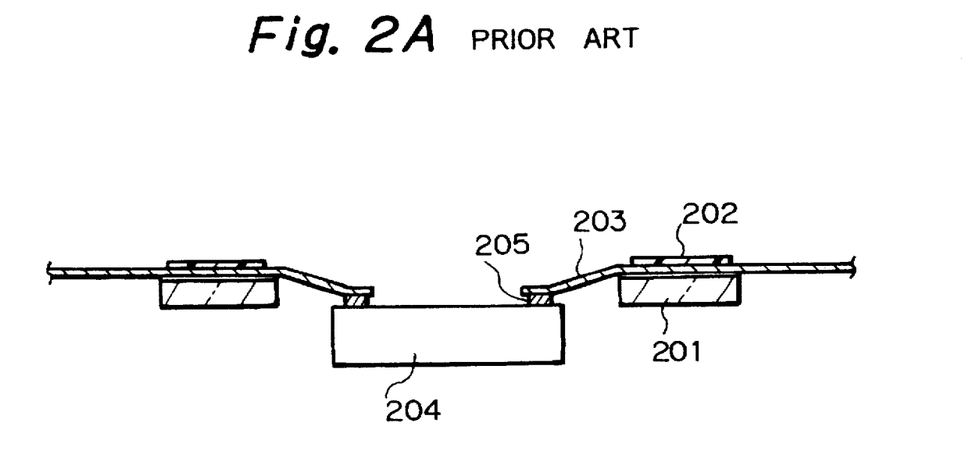
FIGS. 2A and 2B are diagrams for explaining a second prior art method for manufacturing a heat radiating resin-molded semiconductor device.
Figure 2B:
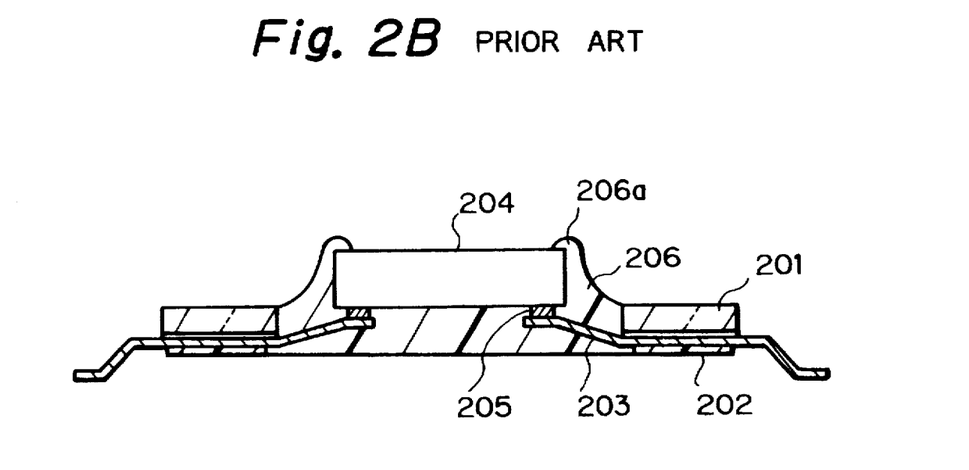

FIGS. 2A and 2B show a second prior art method for manufacturing a heat radiating resin-molded semiconductor device.

In FIG. 2A, reference numeral 201 designates a film carrier tape, and 202 designates a solder resist layer. Leads 203 are sandwiched by the film carrier tape 201 and the solder resist layer 202. Also, reference numeral 204 designates a semiconductor chip 204. Bumps 205 of the semiconductor chip 204 are bonded in a face-up state to the innerlead portions of the leads 203 in an ILB operation.

Next, as shown in FIG. 2B, the device of FIG. 2A is sealed by a potting method or a screen printing method using a liquid resin layer 206, and the liquid resin layer 206 in hardened by curing.

Figure 3A:
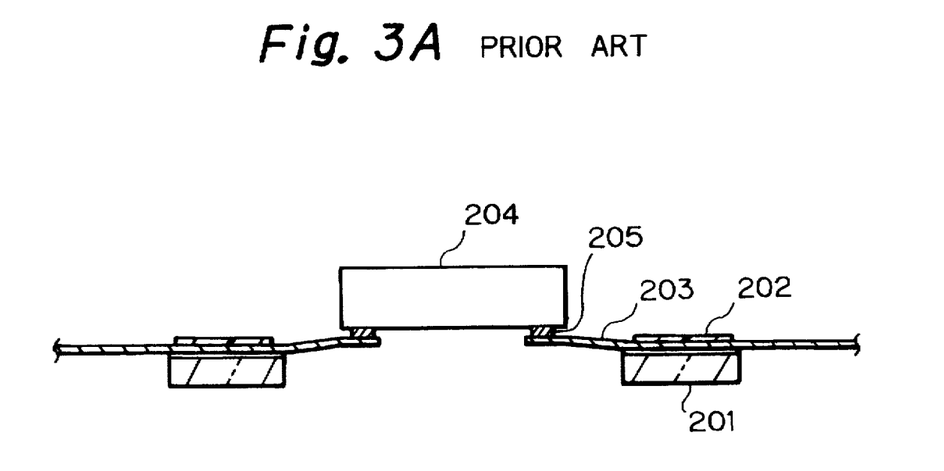
FIGS. 3A and 3B are diagrams for explaining a third prior art method for manufacturing a heat radiating resin-molded semiconductor device.
Figure 3B:
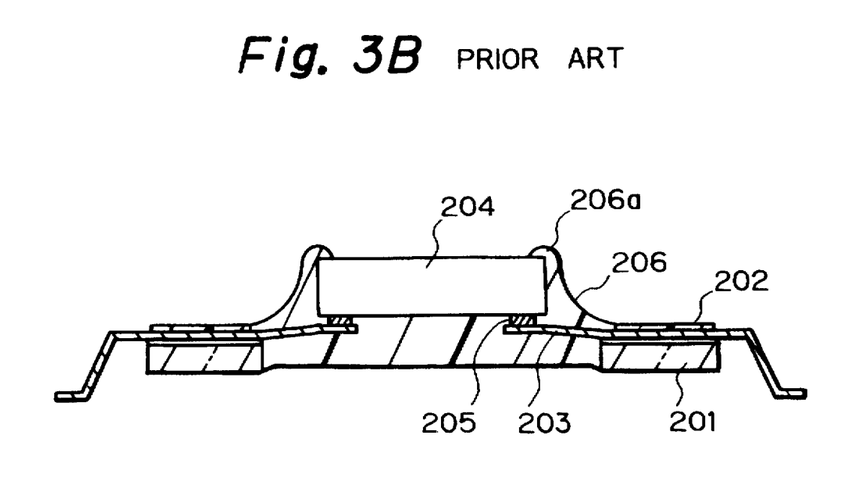

FIGS. 3A and 3B show a third prior art method for manufacturing a resin-molded semiconductor device.

In FIGS. 3A and 3B, an ILB operation is carried out where the semiconductor chip 204 is in a face-down state.

In the prior art method as shown in FIGS. 2A and 2B and FIGS. 3A and 3B, the resin layer 206 may be also formed as a resin layer 206a on the back surface of the semiconductor chip 204. The thickness of the resin layer 206a depends upon the condition of the potting or screen printing method, the kind and viscosity of resin, and the state of the back surface and side surface of the semiconductor chip 204. For example, the thickness of the resin layer 206a may be about 30 to 50 μm. Therefore, since an adhesive layer (not shown) for adhering the semiconductor chip 204 to a heat radiating element such as a heat sink (not shown) is usually about 10 to 20 μm, the adherence between the back surface of the semiconductor chip 204 and the heat radiating element is nonuniform. As a result, the heat radiation effect is reduced, thus creating cracks in the semiconductor chip 204.

FIGS. 4A through 4K show a first embodiment of the method for manufacturing a heat radiating resin-molded semiconductor device according to the present invention.

Figure 4:
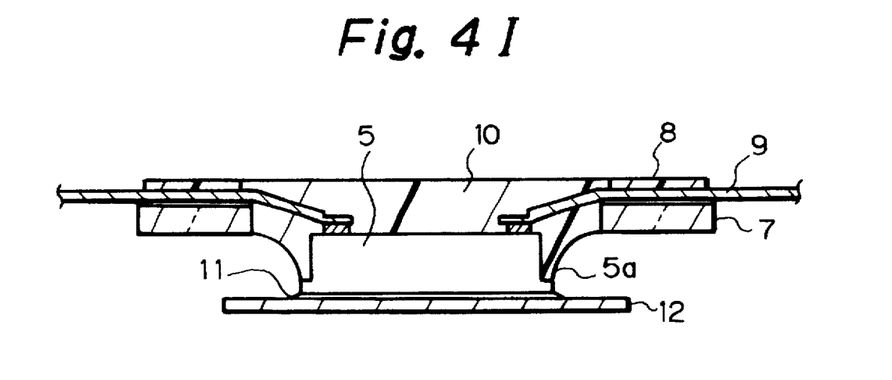
FIGS. 4A through 4K are diagrams for explaining a first embodiment method for manufacturing a heat radiating resin-molded semiconductor device according to the present invention.
Figure 4A:
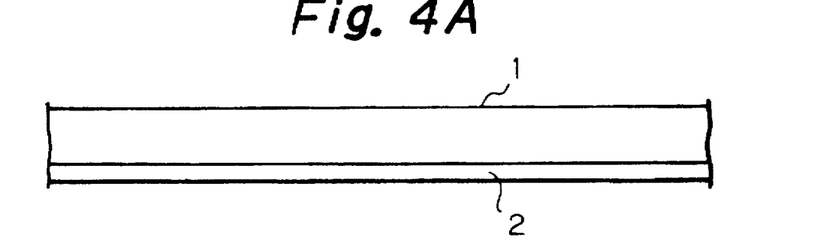

First, referring to FIG. 4A, a wafer 1 is adhered to a dicing sheet 2.

Figure 4B:
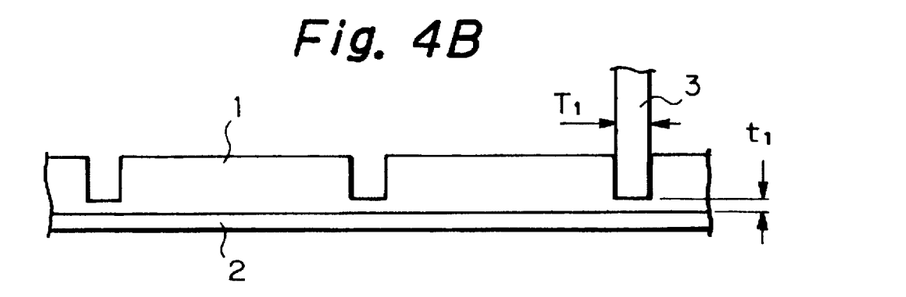

Next, referring to FIG. 4B, a first dicing operation is carried out. That is, the wafer 1 is cut by a blade 3 having a thickness T1 of about 25 to 35 μm, and as a result, a thickness t1 of the wafer 1 is about 50 to 100 μm.

Figure 4C:
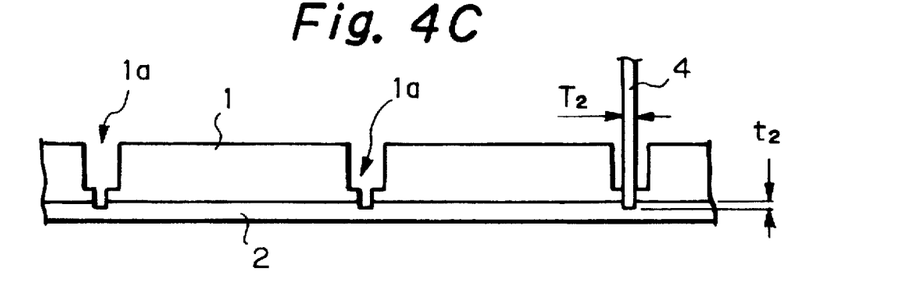

Next, referring to FIG. 4C, a second dicing operation is carried out. That is, the wafer 1 is further cut by a blade 4 having a thickness T2 of about 25 to 35 μm. Subsequently, the dicing sheet 2 is cut by the blade 4, so that a thickness t2 of the dicing sheet 2 is about 30 to 60 μm.

Thus, as shown in FIG. 4C, steps 1a are formed in the wafer 1. This wafer 1 is deassembled into semiconductor chips 5 having protrusions 5a as shown in FIG. 4D.

Figure 4D:
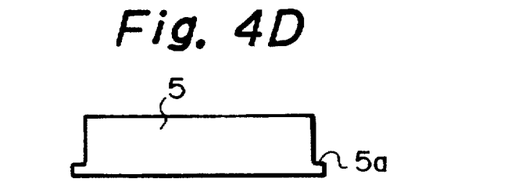

In FIG. 4D, the protrusions 5a have a width of about 12 to 18 μm and a height of about 50 to 100 μm, to prevent a resin layer from being formed on the back surface of the semiconductor chip 5, which will be explained later.

Figure 4E:
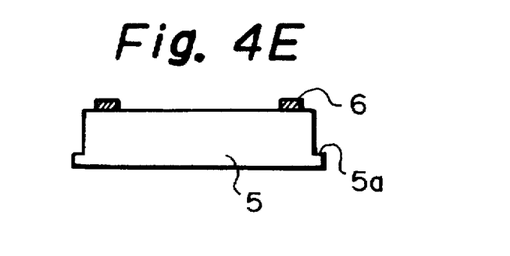

Next, referring to FIG. 4E, about 10 to 30 μm thick bumps 6 made of Au are formed on the surface of the semiconductor chip 5. Note that about 1 to 2 μm thick pad electrodes made of Al or the like can be provided instead of the bumps 6.

Figure 4F:
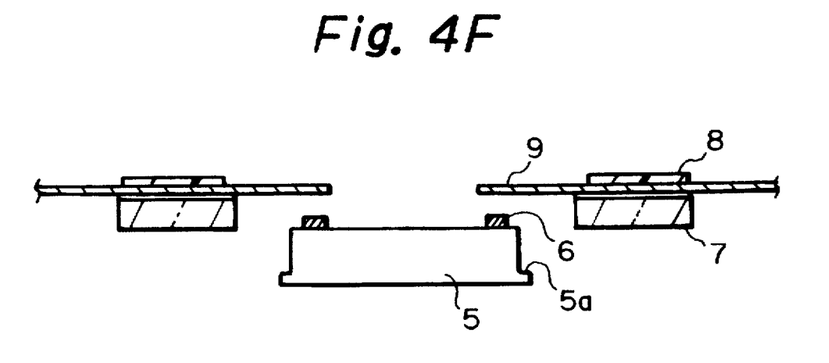

Next, referring to FIG. 4F, a film carrier tape 7 and a solder resist layer 8 sandwich leads 9. An assembly of the film carrier 7, the solder resist layer 8 and the leads 9 are set in an innerlead bonder (not shown), so that the innerlead portions of the leads 9 correspond to the bumps 6 of the semiconductor chip 5. In this case, the leads 9 are made of an about 22 to 32 μm thick copper foil on which an about 0.2 to 1.0 μm thick Au plating layer or an about 0.2 to 1.0 μm thick Sn plating layer is formed. Note that this plating layer can be removed.

Figure 4G:
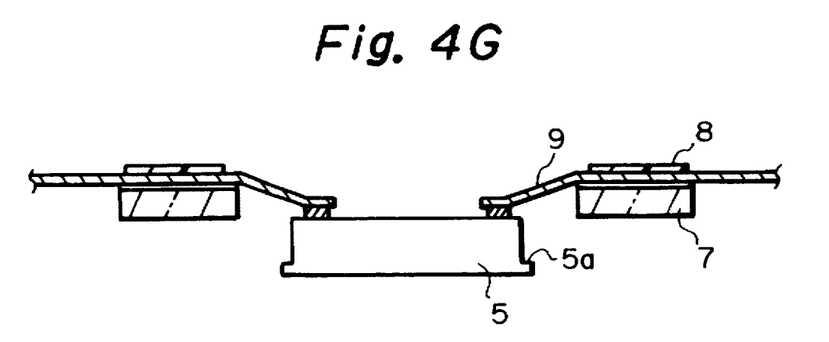

Next, referring to FIG. 4G, an ILB operation is carried out by an innerlead bonder. In this case, if the electrodes of the semiconductor chip 5 are formed by the bumps 6, use is made of a gang method or a single point method. On the other hand, if the electrodes of the semiconductor chip 5 are formed by the pad electrodes, use is made of a single point method.

Figure 4H:
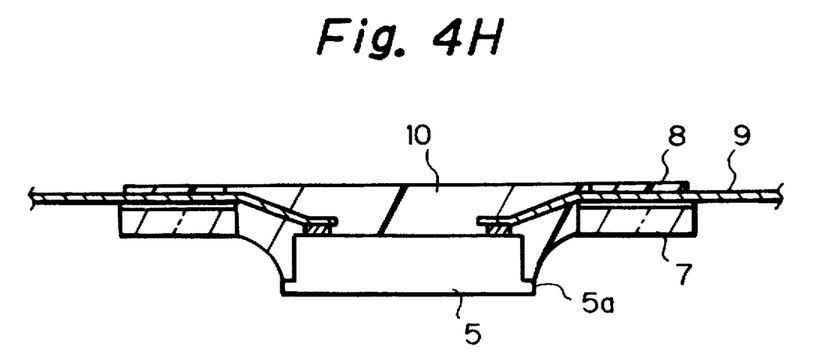

Next, referring to FIG. 4H, the device is sealed by a potting method or a screen printing method using a liquid resin layer 10. Then, the liquid resin layer 10 is hardened by curing. Thus, the semiconductor chip 5 is protected against contamination from the exterior, and the strength of a package is maintained. Note that, the viscosity of the liquid resin layer 10 is changed, and the liquid resin layer 10 flows; however, in this case, the liquid resin layer 10 stops at the protrusions 5a. Therefore, the spread of the liquid resin layer 10 to the back surface of the semiconductor chip 5 can be avoided.

Next, referring to FIG. 4I, an about 10 to 20 μm thick adhesive layer 11 made of Ag paste or epoxy resin is coated on the back surface of the semiconductor chip 5 or an about 0.1 to 0.3 μm thick heat spreader 12, and then, the chip semiconductor chip 5 is adhered by the adhesive layer 11 to the heat spreader 12. The heat spreader 12 is made of Cu Kovar, Mo, W, Cu/W or the like.

Figure 4J:
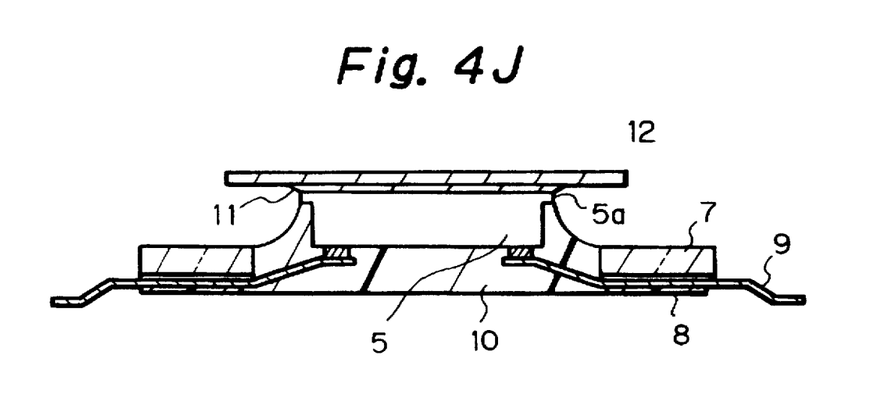
Figure 4K:
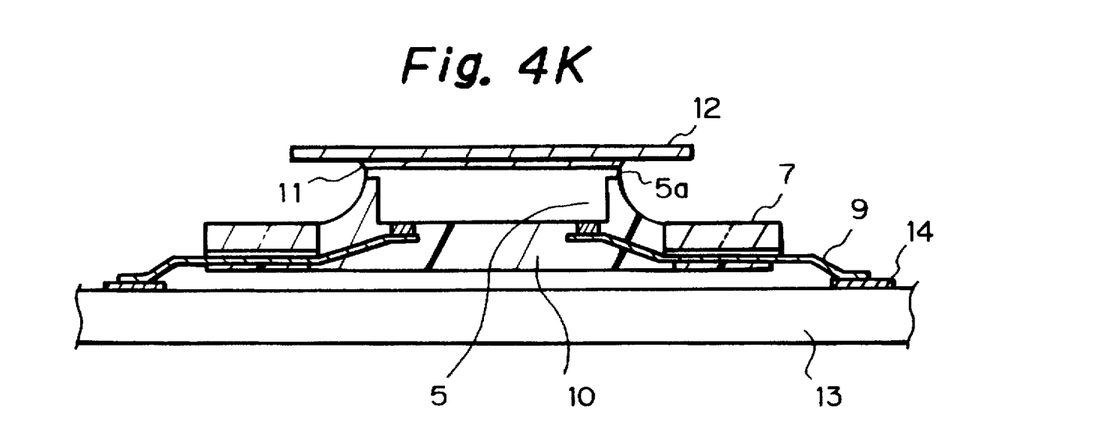

Next, referring to FIG. 4J, a part of the outerlead portions of the leads 9 are cut and are formed in a gull wing shape adapted for a printed board 13 (see FIG. 4K).

Finally, referring to FIG. 4K, the outlead portions of the leads 9 are bonded on outerlead pads of the printed board 13, thus completing the assembly of the device.

In the first embodiment as shown in FIGS. 4A through 4K, the protrusions 5a of the semiconductor chip 5 serve as a dam for the liquid resin layer 10, and as a result, it is possible to prevent the liquid resin layer 10 from being spread to the back surface of the semiconductor chip; 5. Therefore, the heat spreader 12 can be stably mounted on the back surface of the semiconductor chip 5.

Figure 5A:
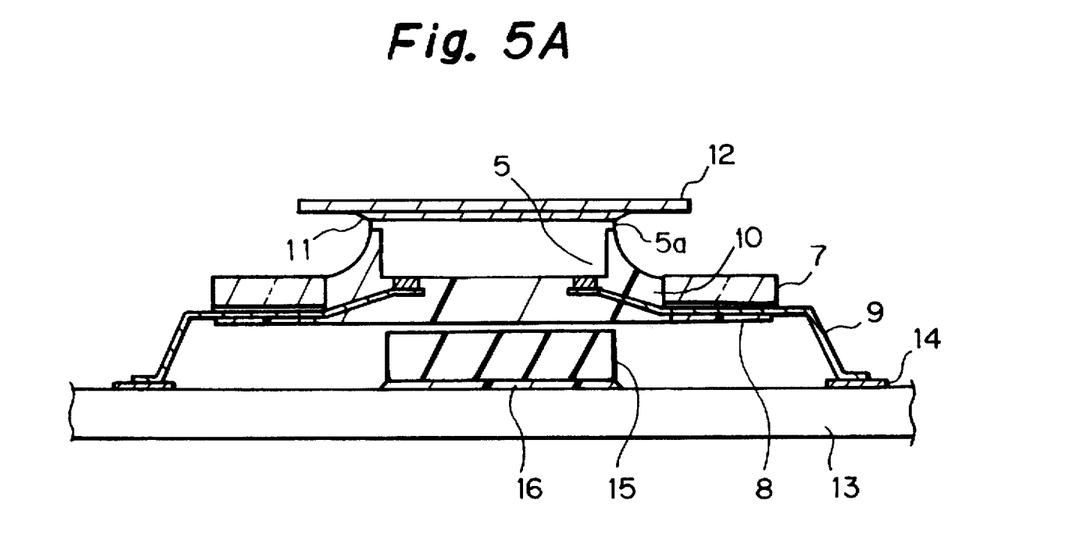
FIG. 5A is diagram for explaining a second embodiment method for manufacturing a heat radiating resin-molded semiconductor device according to the present invention.

In FIG. 5A, whick shows a second embodiment of the present invention, before bonding the outerlead portions of the leads 9 to the printed board 13 as shown in FIG. 4K, an elastic member 15 made of silicone rubber is adhered by an adhesive layer 16 to the printed board 13. Since the elastic member 15 is located immediately below the liquid resin layer 10, the elastic member 15 serves as an element for supporting the pressure of the package. As a result, the adhering strength of the outerlead portions of the leads 9 to the printed board 13 can be stabilized.

Figure 5B:
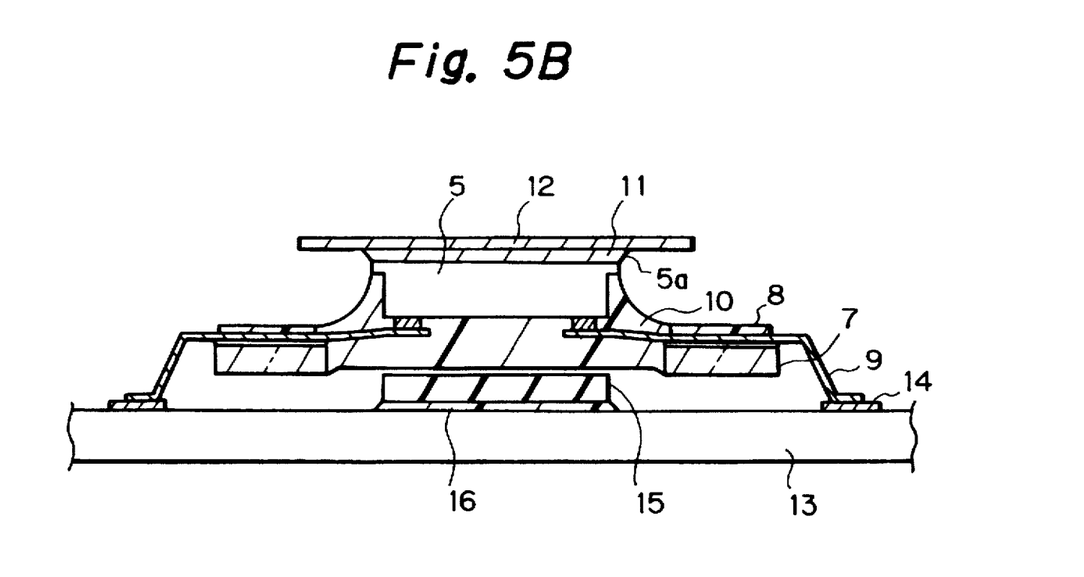
FIG. 5B is a diagram showing a modification of the device of FIG. 5A.

In FIG. 5B, which shows a modification of the device of FIG. 5A, an ILB operation is carried out by facing the semiconductor chip 5 down toward the film carrier tape 7.

Thus, in FIGS. 5A and 5B, the outerlead portion of the leads 9 can be stabilized by the elastic member 15.

In FIGS. 5A and 5B, since the elastic member 15 can absorb the pressure of the device when the heat spreader 12 is mounted on the back of surface of the semiconductor chip 5, it is possible to mount the heat spreader 12 on the back surface of the semiconductor chip 5 after an OLB operation is carried out.

Figure 6:
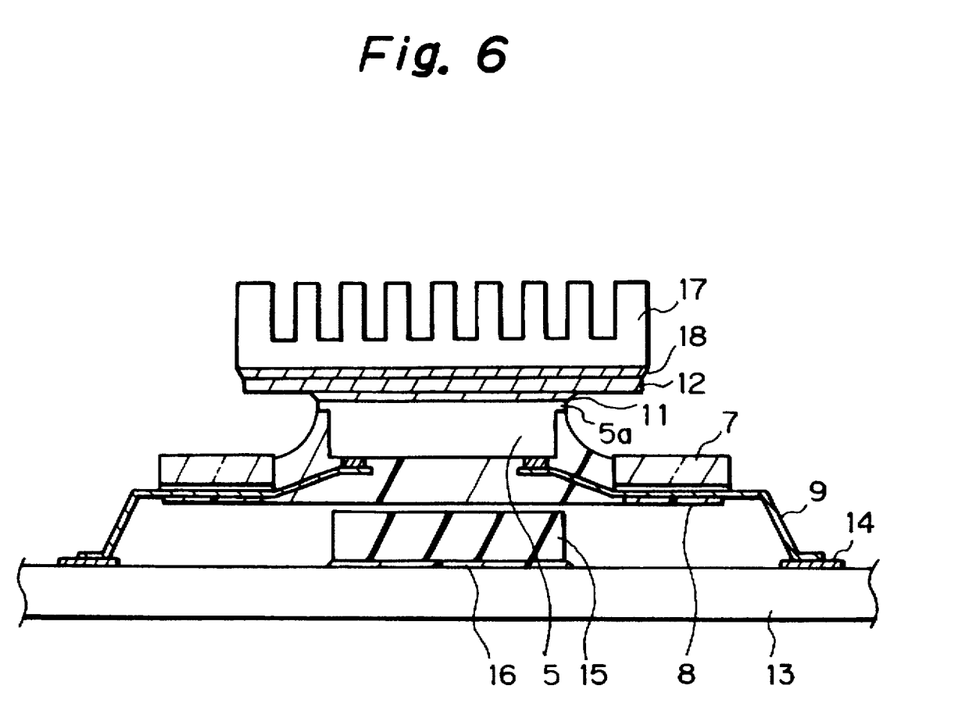
FIG. 6 is diagram for explaining a third embodiment method for manufacturing a heat radiating resin-molded semiconductor device according to the present invention.

In FIG. 6, which shows a third embodiment of the present invention, after the operation as shown in FIG. 5A, a heat sink 17 is adhered by an adhesive layer 18 to the heat spreader 12. Even in this case, the elastic member 15 can absorb the pressure of the device. Therefore, the outerlead portions of the leads 9 can be stabilized.

Thus, in the third embodiment as shown in FIG. 6, even when the semiconductor chip 5 has a high power output such as 20 to 40 W, the heat radiation effect can be improved.

Figure 7:
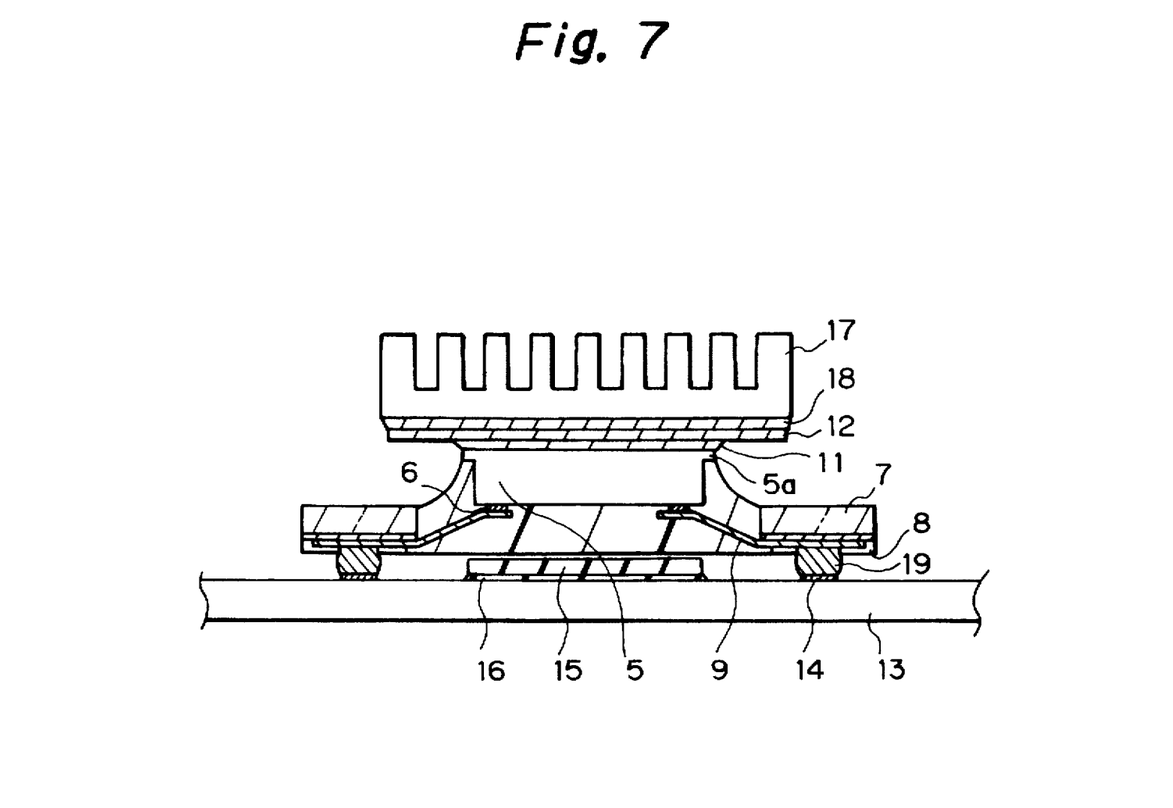
FIG. 7 is diagram for explaining a fourth embodiment method for manufacturing a heat radiating resin-molded semiconductor device according to the present invention.

In FIG. 7, which shows a fourth embodiment of the present invention, solder bumps 19 are used instead of the outerlead portions of the leads 9 of FIG. 6, and the solder bumps 19 are bonded to the outerlead pads 14. Note that the solder bumps 19 can be formed by a solder ball supplying method, a screen method, a dispenser method, an injection method or a ball bonding method using solder wires. Thus, the present invention can be applied to a tape ball grid array (BGA).

As explained hereinabove, according to the present invention, since a liquid resin layer is hardly formed on the back surface of a semiconductor chip, the mounting of a heat radiator such a heat spreader and a heat sink can be stably carried out, which can enhance the heat dissipation.

I claim:

1. A method for manufacturing a heat radiating resin-molded semiconductor device, comprising the steps of:

forming a protrusion on a side peripheral surface of a semiconductor chip;

sealing said semiconductor chip with resin, so that spreading of said resin toward a back surface of said semiconductor chip is prevented by said protrusion; and mounting a heat radiator on a back surface of said semiconductor chip after said semiconductor chip is sealed.

2. The method as set forth in claim 1, further comprising a step of mounting said semiconductor chip on a board after said heat radiator is mounted.

3. The method as set forth in claim 2, further comprising a step of mounting an elastic member on said board, said semiconductor chip mounting step mounting said semiconductor chip on said board by facing said semiconductor chip to said elastic member.

4. The method as set forth in claim 2, wherein said semiconductor chip mounting step mounts said semiconductor chip on said board by bonding outerlead portions of leads connected to said semiconductor chip to said board.

5. The method as set forth in claim 2, wherein said semiconductor chip mounting step mounts said semiconductor chip on said board by bonding bumps provided on leads connected to said semiconductor chip to said board.

6. A method for manufacturing a heat radiating resin-molded semiconductor device, comprising the steps of:

cutting a wafer by using a two-process dicing method to form at least one semiconductor chip having a protrusion on a side peripheral surface of said semiconductor chip;

innerlead-bonding leads mounted on a film carrier to said semiconductor chip;

sealing said semiconductor chip with resin, so that spreading of said resin toward a back surface of said semiconductor chip is prevented by said protrusion; and mounting a heat spreader on a back surface of said semiconductor chip after said semiconductor chip is sealed.

7. The method as set forth in claim 6, further comprising a step of outerlead-bonding said leads to a board after said heat spreader is mounted.

8. The method as set forth in claim 7, wherein said board has an elastic member for facing said semiconductor chip.

9. The method as set forth in claim 6, further comprising a step of mounting bumps provided on said leads to a board after said heat spreader is mounted.

10. The method as set forth in claim 9, wherein said board has an elastic member for facing said semiconductor chip.

11. The method as set forth in claim 6, further comprising a step of mounting a heat sink on said heat spreader.

12. A semiconductor device comprising:

a semiconductor chip having a protrusion on a side peripheral portion of said semiconductor chip;

a film carrier tape;

leads provided on said film carrier tape and innerlead-bonded to said semiconductor chip;

a resin member sealing a top surface of said semiconductor chip and said leads; and a heat radiator mounted on a back surface of said semiconductor chip.

13. The device as set forth in claim 12, further comprising a board to which said leads are outerlead-bonded.

14. The device as set forth in claim 13, further comprising an elastic member mounted on said board and facing said semiconductor chip.

15. The device as set forth in claim 12, further comprising:

solder bumps provided on said leads; and a board connected to said solder bumps.

16. The device as set forth in claim 15, further comprising an elastic member mounted on said board and facing said semiconductor chip.

* * * * *